United States Patent [19]
Lin

[11] Patent Number: 5,893,748
[45] Date of Patent: Apr. 13, 1999

[54] METHOD FOR PRODUCING SEMICONDUCTOR DEVICES WITH SMALL CONTACTS, VIAS, OR DAMASCENE TRENCHES

[75] Inventor: Ming-Ren Lin, Cupertino, Calif.

[73] Assignee: Advanced Micro Devices, Inc., Sunnyvale, Calif.

[21] Appl. No.: 08/799,053

[22] Filed: Feb. 10, 1997

[51] Int. Cl.$^6$ .................................................. H01L 21/4763
[52] U.S. Cl. .......................... 438/618; 438/639; 438/974; 438/942
[58] Field of Search ...................... 438/974, 618, 438/637–639, 942

[56] References Cited

U.S. PATENT DOCUMENTS 5,399,518   3/1995   Sim et al. .
5,616,959   4/1997   Jeng .
5,677,242   10/1997   Aisou .

Primary Examiner—Jey Tsai

[57] ABSTRACT

A method for producing a small feature in a semiconductor device includes depositing a mask material on an unpatterned layer in which an ultra-narrow opening is to be formed, and then masking and etching the mask material to form a narrow opening. A spacer material is then deposited on the mask material, with spacer material settling into and covering the narrow opening. Thereafter, a portion of the spacer material is removed by etching, leaving some spacer material in the opening but exposing an ultra-narrow region of the first layer at the bottom of the opening in the mask material. The ultra-narrow region left uncovered by the spacer material is smaller than the narrow region in the mask material. Once the ultra-narrow region is uncovered, material in the first layer is removed through the ultra-narrow region, by anisotropic etching, for example, to form an ultra-narrow opening in the first layer.

4 Claims, 5 Drawing Sheets

METHOD FOR PRODUCING SEMICONDUCTOR DEVICES WITH SMALL CONTACTS, VIAS, OR DAMASCENE TRENCHES

TECHNICAL FIELD OF THE INVENTION

The present invention relates to semiconductor devices, and in particular to fabrication of high resolution semiconductor devices.

BACKGROUND OF THE INVENTION

In fabrication of semiconductor devices, increasing device density on a given die area provides significant advantages, including speed, power efficiency, and portability. To produce very fine resolution, very small device features and very small circuits are generated by a process of epitaxy, lithography, and etching. In typical processes, layers are deposited on the surface of a substrate and then masked and etched to a predetermined thickness. Lines of a material are then formed by depositing a layer of the material and then masking and etching away the material to form spaces where the layer is not desired. Depositing, masking and etching layers of substrate material allows the fabrication of very small semiconductor substrate features. However, because of uncertainties in the original thickness of a layer and uncertainties in etch rate, trace amounts of the material are occasionally left on the substrate. When the material is a conductor, for example, metal, the trace amounts of material often cause short circuits between the lines. Damascene techniques avoid this problem by depositing an insulating layer, forming trenches in the insulating layer, and then depositing the metal or other material within the trenches.

Damascene trenches are frequently formed by photolithographic patterning of the insulating layer, to achieve trench dimensions as small as possible. Photolithography produces very fine resolution on a substrate, but the resolution is limited by the particular wavelength used. But manufacturing constraints associated with the technologies capable of producing extremely high resolution, and in particular fine and closely spaced lines, hamper development of dies having greater device density. Damascene techniques therefore suffer from the same wavelength-dependent size limitations as other approaches to die manufacture. For deep-UV frequencies, each frequency carries a feature size limitation.

Presently, Deep-UV wavelengths are commonly used for fine-resolution lithography, and are considered state of the art. The E, G, H, and I lines of the deep-UV wavelengths are as short as 365 nm, which prevents the easy processing of a feature size finer than 248 nm (2480 Å). Switching to a higher frequency would theoretically allow greater density, but would be prohibitively expensive due to a consequent need to develop new equipment, fabrication techniques, or resists appropriate to the shorter wavelengths, and the need to make presently available methods at the shorter wavelengths cost effective.

Some approaches to reducing feature size without switching to a higher frequency have been attempted. For example, phase-controlled interference patterns have been used with some success. These techniques place layers that are phase-shifting and transparent to the particular wavelength over (or under) some areas on a mask before exposing the mask, thus generating and positioning points of constructive and destructive interference on photoresistive materials. In addition to adding, large expense, these methods require broader areas of the device substrate to be exposed simultaneously, and the patterns desired must be highly repetitive for these methods to be appropriate. The added expense comes, in part, from the need to use materials and technologies matched to the resist and to the wavelength, and the material is difficult to align. Also, adjacent areas of constructive interference are often seen as a single large region, and are not resolved in some cases.

SUMMARY OF THE INVENTION

There is a need for extremely narrow features in semiconductor devices, and for a process that uses presently available technology, tools, and materials to reduce feature size of device features, such as damascene trenches. There is also a need for an approach to fabrication that will allow future generation technologies to produce smaller device features than would otherwise be predicted. Due to the expense of using extremely high-frequency ultra-fine size lithography, there is also a need for a process that enables manufacturers to achieve the same fineness of resolution using less expensive lithography techniques.

These and other needs are met embodiments of the present invention which provide a method for producing a small feature in a semiconductor device that comprises the steps of depositing a mask material on a first layer in which an ultra-narrow opening is to be formed, and then masking and etching the mask material to form a narrow opening in the mask material. A spacer material is then deposited on the mask material, with the spacer material settling into and covering the narrow opening. Thereafter, a portion of the spacer material is removed by etching, leaving, some spacer material in the opening but exposing an ultra-narrow region of the first layer at the bottom of the opening, in the mask material. The ultra-narrow region left uncovered by the spacer material is smaller than the narrow opening in the mask material. Once the ultra-narrow region is uncovered, material in the first layer is removed through the ultra-narrow region, by anisotropic etching, for example, to form an ultra-narrow opening, in the first layer.

Accordingly, the present invention uses well understood processes appropriate to a given technology to provide features smaller in size than would otherwise be possible. Several aspects of the present invention approach also increase the performance of the products, by scaling existing technology in a controllable fashion. Much smaller trenches can be formed in a given layer than would otherwise be predicted, without the need to use a shorter wavelength. Also, cheaper methods using longer wavelengths can be used in accordance with several aspects of the present invention, without loss of feature resolution.

Another advantage of the present invention is that any defect openings in the first layer will be automatically filled by the spacer mask material at the same time the spacer mask is filling, the narrow opening, in the mask material where the ultra-narrow region will be formed. This additional benefit prevents holes below a given critical dimension from causing a problem since they are filled and covered by the spacer material and are isolated from the other layers of the semiconductor device.

The foregoing and other features, aspects and advantages of the present invention will become more apparent from the following detailed description of the present invention when taken in conjunction with the accompanying drawings.

DETAILED DESCRIPTION OF THE DRAWINGS

Figure 1:
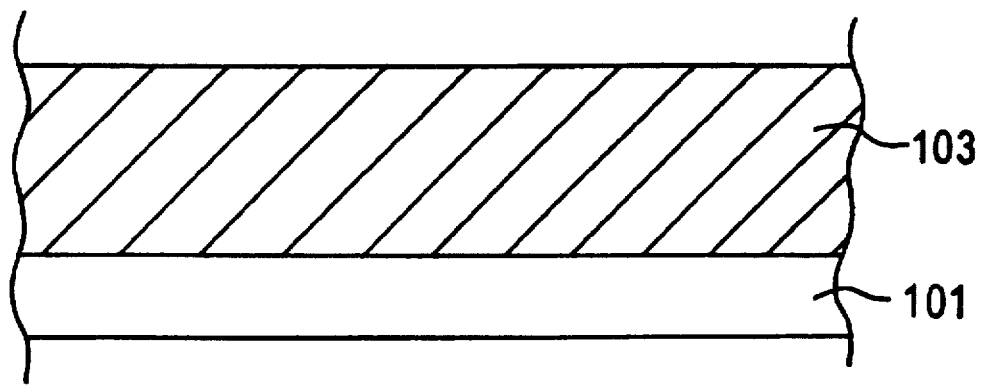
FIG. 1 depicts a cross-sectional view of an insulating layer on a substrate.

Referring to FIG. 1, according to one exemplary embodiment of the present invention, a layer 103 is provided on top of a substrate 101. In the exemplary embodiment described below, the layer 103 is an insulating layer. However, this is exemplary only, as the present invention can be applied to other types of layers, such as conductor layers.

Figure 2:
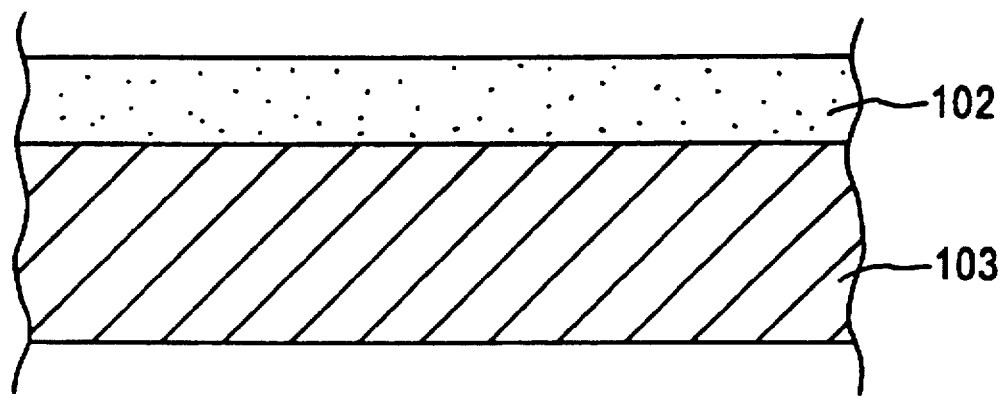
FIG. 2 depicts a layer of hard mask material deposited onto the insulating layer according to a first embodiment of the present invention.

As shown in FIG. 2, a layer of hard mask material 102 is deposited onto the conductor layer 103. The layer of hard mask material 102 is composed of a material that has a good etch selectivity as compared to the conductor layer 103, so that a pattern can be etched into the layer of hard mask material 102 without substantial over-etching into the conductor layer 103.

Figure 3:
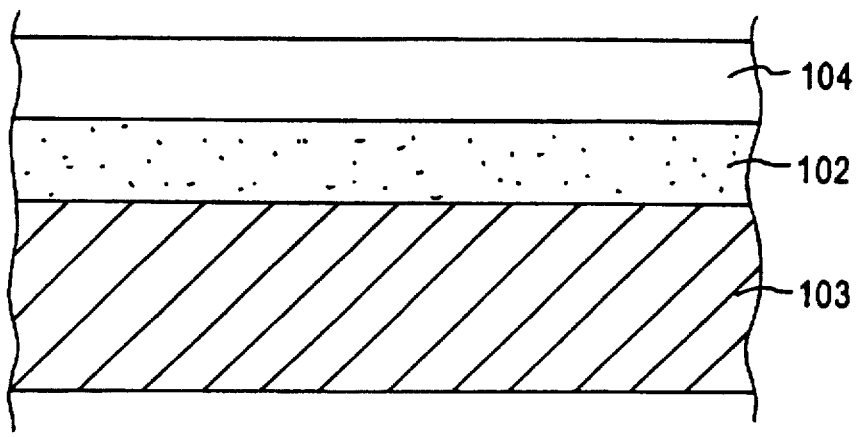
FIG. 3 depicts the structure of FIG. 2 after placement of a photo-resist material on top of the hard mask material, according to the first exemplary embodiment of the present invention.

As shown in FIG. 3, on top of the hard mask material 102, a photo-resist material 104 is spun. The photo-resist material 104 is highly sensitive to lithographic patterning by the I-line radiation in the deep-UV band. It will be apparent that, in other embodiments, other photo-resist layers sensitive to other wavelengths are used. For example, photo-resist layers sensitive to wavelengths shorter than the wavelengths used in present lithography may be used with the process of the present invention.

Figure 4:
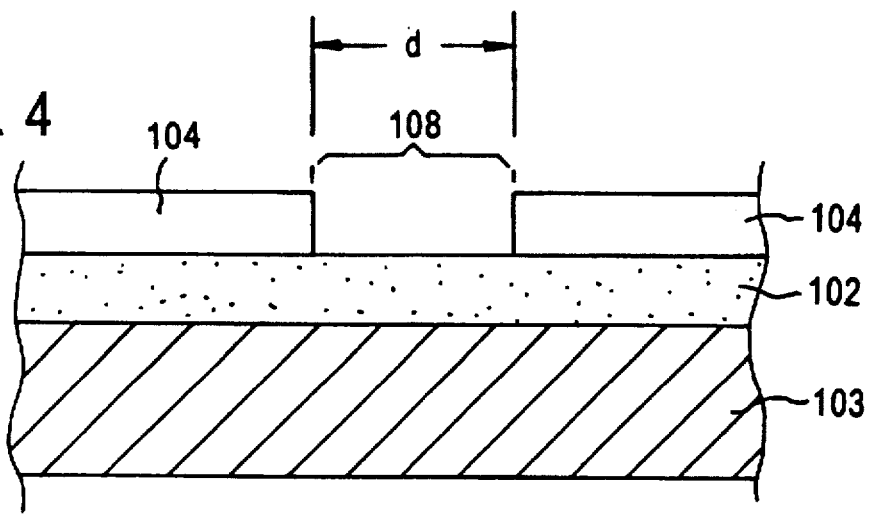
FIG. 4 depicts a structure resulting from patterning the photo-resist material by exposure to radiation of a wavelength in the deep-UV band, according to the first exemplary embodiment of the present invention.

Referring to FIG. 4, after the photo-resist material 104 is deposited, the photo-resist material 104 is patterned by exposure to radiation of a wavelength in the deep-UV band, according to a pattern. The photo-resist material 104 is then cleaned. The pattern imposed on the photo-resist material 104 includes small openings, such as narrow trenches or slots, including narrow opening 108 of dimension d. It should be apparent to those of ordinary skill in the art that the present inventions is applicable to openings other than trenches or slots, such as holes or vias, etc. such as holes, etc. In order to appreciate some of the advantages of the present invention, the following description assumes that the dimension d is the smallest dimension achievable with patterning technology, due to the wavelength limitations. However, the present invention is applicable to applications in which the dimension d is larger than this smallest achievable dimension. In the narrow opening 108, the photo-resist material 104 is either completely removed or extremely thin.

It will be understood that the same approach used in accordance with the described embodiments of the present invention to produce the ultra-narrow opening, such as a damascene trench, is used in other embodiments of the invention to produce an ultra-narrow space between devices or between metal lines.

Figure 5:
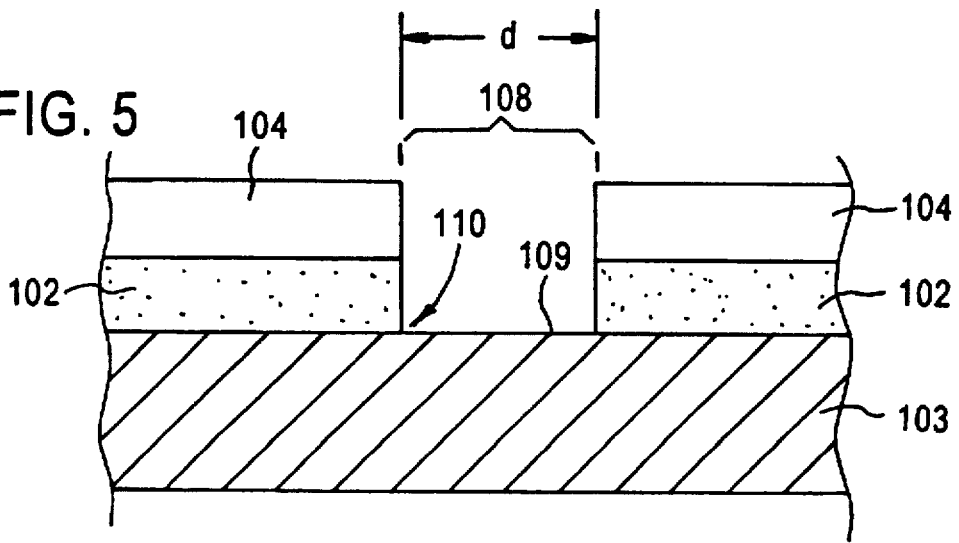
FIG. 5 depicts a structure resulting from a subsequent step of hard mask etching according to the first exemplary embodiment of the present invention.

Referring to FIG. 5 after the pattern is transferred to the photo-resist material 104, a subsequent step of hard mask etching removes hard mask material 102 in accordance with the pattern provided by the photo-resist material 104. Hence, a narrow opening of dimension d is created in the hard mask material 102 by the etching. The narrow opening 108 as etched into the hard mask material 102 exposes a region of the conductor layer 103 at a surface 109 of the conductor layer 103. The etching and patterning of the hard mask material 102 provides a corner 110, where the substantially horizontal exposed portion of the surface of the conductor layer 103 meets a substantially vertical wall of the narrow opening 108 in the hard mask material 102. According to the first exemplary embodiment, the pattern thus transferred to the hard mask material 102, including the narrow opening 108 of dimension d, may be of the smallest size possible using, standard lithographic techniques for a given frequency.

Figure 6:
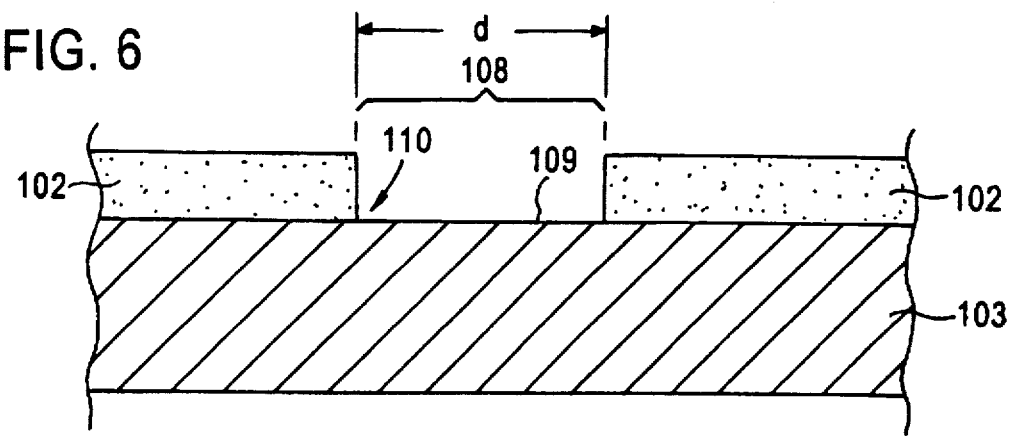
FIG. 6 depicts a die and a patterned layer of hard mask material, according to the first exemplary embodiment of the present invention.
Figure 7:
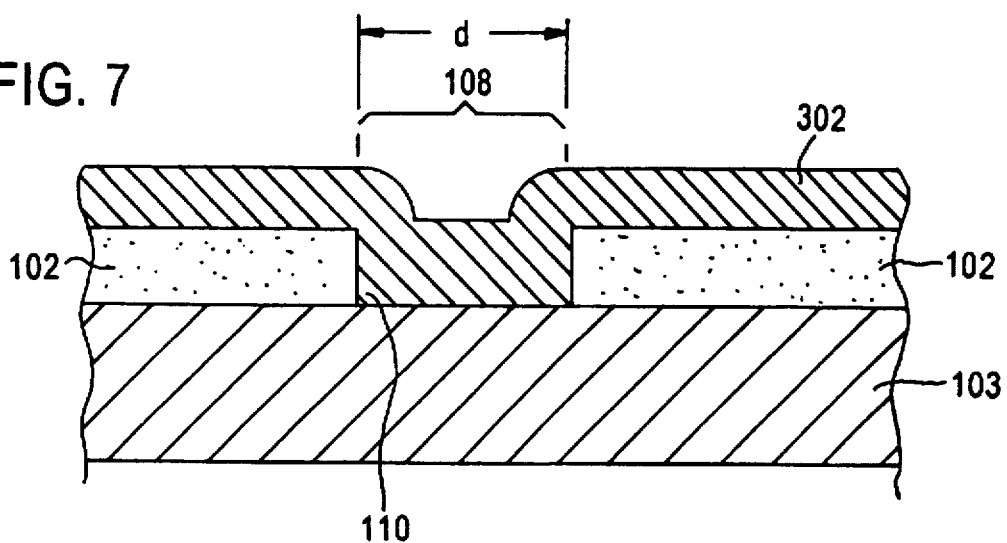
FIG. 7 depicts a structure having a spacer material deposited over a layer of photoresist material and dipping into a narrow opening in the photo-resist material, according to the first exemplary embodiment of the present invention.

As seen in FIG. 6, after the hard mask material 102 is patterned, the layer of photo-resist material 104 is optionally removed, leaving only the substrate 106 and the patterned layer of hard mask material 102. In other embodiments of the invention, the photo-resist material 104 is left on the hard mask layer 102. As depicted in FIG. 7, after the photo-resist material 104 is removed, a spacer material 302 is advantageously deposited over the layer of photo-resist material 104 and dips into the narrow trench 108. The spacer material 302 is highly sensitive to a known hard mask etching process and relatively opaque to a known substrate etching process. Deposits of the spacer material 302 form in the corner 110. In some embodiments, the spacer material 302 completely fills the narrow opening 108. In other embodiments, spacer material 302 does not completely fill the narrow opening 108, but rather covers only a portion of the region of the narrow opening 108.

Figure 11:
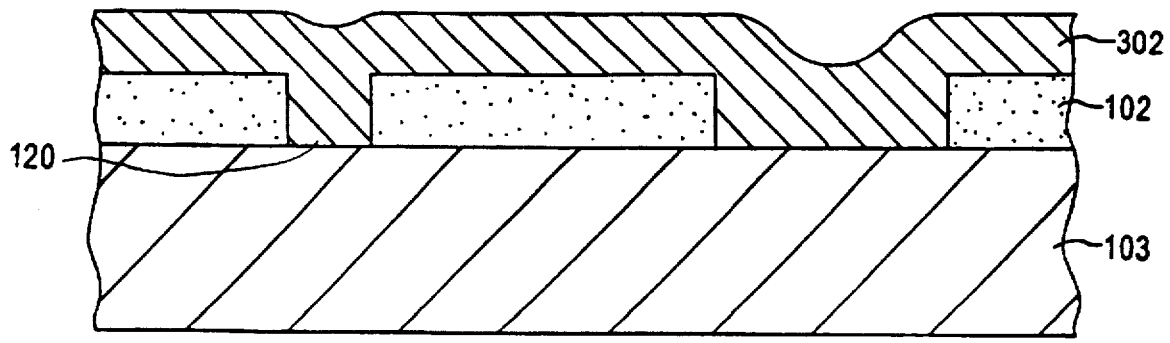
FIG. 11 depicts a cross-section of the device similar to FIG. 7, but also depicts a hole that is covered in accordance with an embodiment of the present invention.
Figure 12:
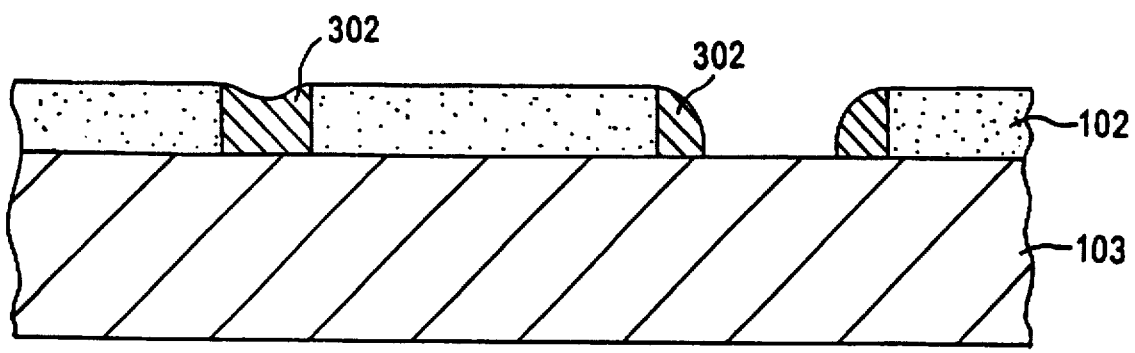
FIG. 12 depicts a cross-section of the device of FIG. 11, after an etching process to which the spacer material is sensitive.

The present invention provides the advantage of mitigating defects in a layer. As depicted in FIG. 11, a defect 120 is present in the hard mask material 102. The defect 120 may create problems in the final device. However, assuming that the defect 120 has a dimension below some critical dimension, the problems can be mitigated by the filling of the defect 120 with the spacer material 302. When the subsequent etching process following the filling of the spacer material 302 is performed, the defect 120 is of too small a dimension relative to the narrow opening 108 and so completely filled that the subsequent etching, process will not be able to proceed completely through the conductor layer 103. Thus, minor defects in the hard mask material 102 are filled, as seen in FIG. 12, and prevented from causing problems in the device. Thus, the process is self-curing and repairs defects in the hard mask material 102.

Figure 8:
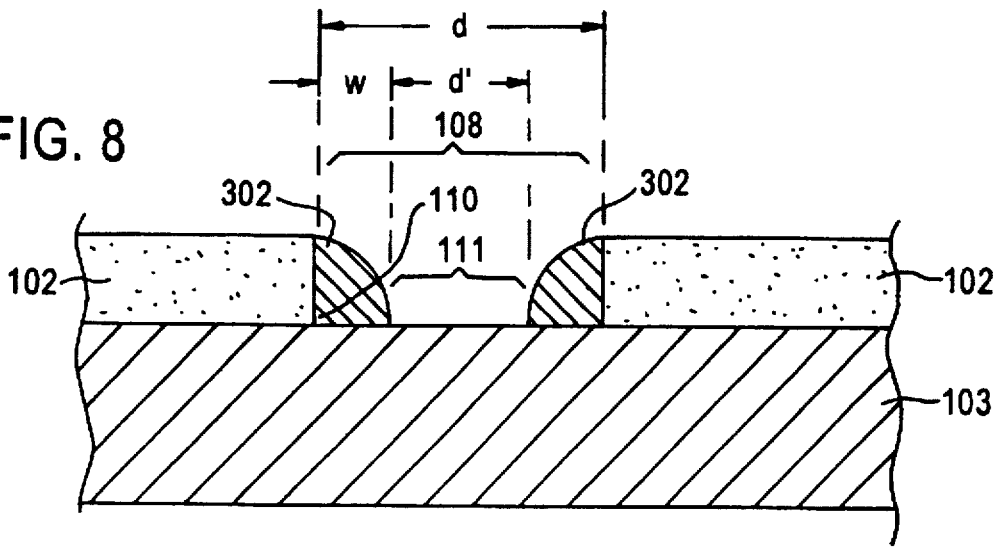
FIG. 8 depicts a structure resulting from an etching process to which the spacer material is sensitive, according to the first exemplary embodiment of the present invention.

Referring to FIG. 8, after the spacer material 302 is deposited, an etching process to which the spacer material 302 is sensitive is applied to the spacer material 302. In some embodiments the etching process is highly selective, so that there is substantially no undercutting of the conductor layer 103. The etching process has an etch rate with respect to the spacer material 302 that is known, so that the etching process can be interrupted when the amount of spacer material 302 remaining is such that some of the conductor layer 103 is exposed and some of the spacer material 302 remains in the narrow opening 108. In other words, the etching, process leaves behind a residual amount of spacer material 302 in the corner 110, where the spacer material 302 was thickest, while simultaneously exposing an ultra-narrow region 111 of dimension d' within the narrow opening 108 of dimention d, through which the conductor layer 103 is exposed. The residual amount of spacer material 302 has a dimension w, less than the entire dimension of the opening 108. The ultra-narrow region 111 of dimension d' is therefore much smaller than the narrow opening 108 of dimension d.

As further depicted in FIG. 8, the remaining regions of the layer of hard mask material 102 to-ether with the spacer material 302 completely cover the conductor layer 103 except where the ultra-narrow region 111 of dimension d' allows the conductor layer 103 on to be exposed.

Figure 9:
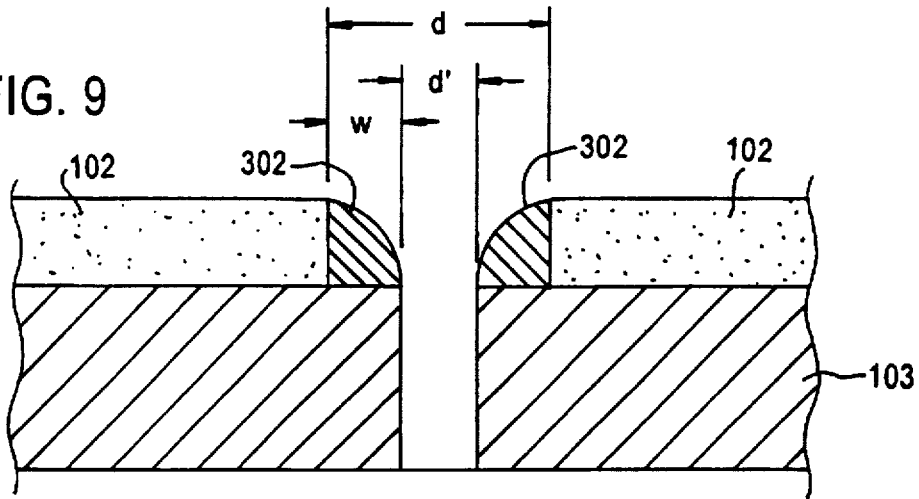
FIG. 9 depicts a structure resulting from the substrate etching process toward which the spacer material is known to be highly opaque, according to the first exemplary embodiment of the present invention.

Referrng to FIG. 9, when the ultra-narrow region 111 has been defined, the substrate etching process toward which the spacer material 302 is known to be relatively opaque is conducted. The conductor layer etching process is one to which the conductor layer 103 is highly selective, but which is blocked by both the hard mask material 102 and the remaining deposits of spacer material 302. Thus, the ultra-narrow region 111 of dimension d' is the only region of the conductor layer 103 exposed to the etching process. The resulting structure is depicted in FIG. 9. An ultra-narrow opening, in the conductor layer 103 of dimension d' can thus be produced, smaller than would otherwise be produced by standard lithographic methods.

Figure 10:
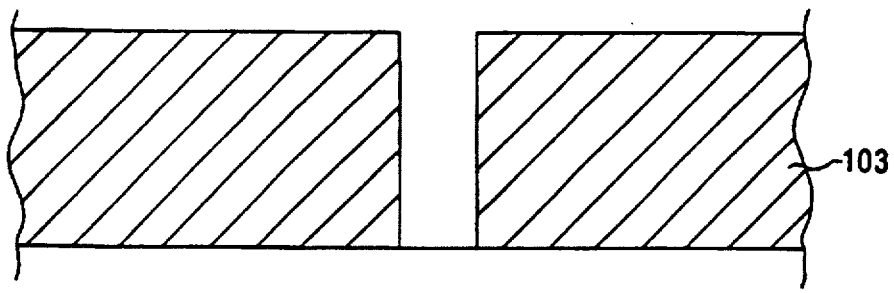
FIG. 10 depicts the resulting structure after the hard mask material and the residual spacer material are removed, according to the first exemplary embodiment of the present invention.

Finally, as shown in FIG. 10, the hard mask material 102 and the residual spacer material 302 are removed, leaving a conductor layer 103 having an ultra-narrow opening of dimension d'. This opening may be filled with metal, for example, and leveled with conventional CMP (chemical mechanical planarization) techniques.

Although the present invention has been described and illustrated in detail, it is to be clearly understood that the same is by way of illustration and example only and is riot to be taken by way of limitation, the spirit and scope of the present invention being limited only by the terms of the appended claims.

What is claimed is:

1. A method for producing a narrow opening in a layer of a semiconductor device, the method comprising the steps of:

depositing a mask layer onto a first layer in which the opening is to be formed, said mask layer having at least one defect opening exposing said first layer and being of a dimension below a critical dimension;

transferring a pattern onto the mask layer by creating an opening in the mask layer, said opening having a dimension substantially greater than that of the defect opening;

depositing a spacer mask layer of spacer mask material onto the mask layer, the spacer mask material extending into the interior of the mask layer opening and the defect opening;

removing a portion of the spacer mask layer, leaving the defect opening substantially filled with the spacer mask material and a deposit of spacer mask material in the interior of the mask layer opening such that only a portion of the mask layer opening is covered by the spacer mask material;

removing a portion of the first layer through the portion of the mask layer opening not covered by the spacer mask material to create the narrow opening in the first layer, the spacer mask material substantially filling the defect opening preventing removal of any portion of the first layer through the defect opening; and removing the mask layer and the spacer mask material which substantially fills the defect opening and covers a portion of the mask layer opening.

2. The method of claim 1, wherein the step of transferring a pattern onto the mask layer includes the steps of masking the mask layer with a photo-resist layer, forming, a pattern in the photo-resist layer and etching the mask layer in accordance with the pattern formed in the photo-resist layer.

3. The method of claim 1, wherein the step of removing the portion of the spacer mask material includes anisotropic etching.

4. The method of claim 3, wherein the step of removing a portion of the first layer includes anisotropic etching, of the first layer.

* * * * *